United States Patent

Kuno et al.

[15] 3,668,552

[45] June 6, 1972

[54] PUSH-PULL TRANSFERRED ELECTRON OSCILLATOR

[72] Inventors: Hiromu J. Kuno, Palos Verdes Peninsula, Calif.; Bertrand E. Berson, Trenton; James F. Reynolds, Cranbury, both of N.J.

[73] Assignee: The United States of America as represented by the Secretary of the Air Force

[22] Filed: Apr. 29, 1971

[21] Appl. No.: 138,423

Related U.S. Application Data

[62] Division of Ser. No. 886,238, Dec. 18, 1969, abandoned.

[52] U.S. Cl. ..........................331/100, 331/102, 331/107 G, 333/84 M

[51] Int. Cl. ..........................H03b 7/14

[58] Field of Search............331/96, 100, 102, 107 R, 107 G, 331/107 T; 333/82 A, 84 M

[56] References Cited

UNITED STATES PATENTS

| | | | |
|---|---|---|---|
| 3,231,831 | 1/1966 | Hines | 331/96 |
| 3,550,035 | 12/1970 | Robrock | 331/107 G |
| 3,452,221 | 6/1969 | Gunn | 331/107 G X |
| 3,416,099 | 12/1968 | Vane | 331/96 X |

*Primary Examiner*—Roy Lake
*Assistant Examiner*—Siegfried H. Grimm
*Attorney*—Harry A. Herbert, Jr. and George Fine

[57] ABSTRACT

A push-pull transferred-electron oscillator circuit in which a number of transferred-electron devices are connected in parallel to a DC bias circuit, but, in the RF (radio frequency) circuit, they operate in a push-pull manner so that the RF power is increased by four times for the same RF impedance.

2 Claims, 7 Drawing Figures

INVENTORS
HIROMU J. KUNO
BERTRAND E. BERSON
BY JAMES F. REYNOLDS

Harry A. Herbert Jr. and George Fine

ATTORNEYS

INVENTORS
HIROMU J. KUNO
BERTRAND E. BERSON
JAMES F. REYNOLDS
BY Harry A. Herbert Jr. and George Fine
ATTORNEYS

PUSH-PULL TRANSFERRED ELECTRON OSCILLATOR

CROSS-REFERENCES TO RELATED APPLICATION

The present patent application is a division of U.S. Pat. application No. 886,238, filed 18 Dec. 1969, entitled "PUSH-PULL OSCILLATOR", by Hiromu J. Kuno, Bertrand E. Berson and James F. Reynolds and now abandoned.

BACKGROUND OF THE INVENTION

This invention relates to oscillator circuits, and more particularly to circuits including a multiplicity of transferred-electron devices connected in the RF circuit in a push-pull manner.

A transferred electron device (also called Gunn effect device) consists of a crystal of GaAs or other III–V or II–VI compound or alloys of III–V or II–VI compounds, with ohmic contacts. A transferred-electron device exhibits a voltage controlled negative resistance when it is biased at a voltage above the threshold. This negative resistance results in voltage and current instabilities at microwave frequencies and the device can therefore generate microwave power. One example of a transferred electron device is shown and described in U.S. Pat. No. 3,393,375, issued 16 July 1968, entitled, "Circuits for Combining the Power Outputs of a Plurality of Negative Resistance Device Oscillators".

In order to generate high RF output power, a number of the aforementioned devices may be connected in RF parallel. However, typical transferred-electron devices exhibit relatively low impedance (a few ohms or less). Thus, it is impractical to connect many devices in parallel since the impedance becomes very low, making it difficult to couple out power,.$I^2R$ losses in the bias circuit become very high, for a parallel circuit. (See "Electronic Letters", 17 May 1968, Volume 4, No. 10.)

Another way of achieving high RF output power is to connect a number of devices in series. In this way the RF impedance level becomes higher. However, if the device characteristics are not well matched, one of the devices may take most of the total voltage across the devices and it may be destroyed by high power dissipation. Thus, the prior art transferred-electron oscillator circuits have deficiencies which limit their usefulness.

SUMMARY OF THE INVENTION

The present invention provides improved transferred electron (TEO) circuit configurations. In the new oscillator circuit configurations, a number of TEO devices are connected in parallel in the bias circuit but they are in a push-pull configuration in the RF circuit. In this way, high RF impedance level can be maintained and $I^2R$ losses kept to a minimum with high power. This invention has a wide, immediate application in microwave communication systems.

An object of the present invention is to provide a push-pull transferred-electron oscillator circuit in which a number of transferred-electron devices are connected in push-pull arrangement in the RF portion of the circuit.

Another object of the present invention is to provide an improved transferred-electron circuit oscillator wherein a multiplicity of transferred-electron devices are connected in parallel in the bias circuit but are in a push-pull configuration in the RF circuit.

Further objects and features of this invention will be apparent from a study of the following detailed description and drawings.

DETAILED DESCRIPTION OF THE PREFERRED EMBODIMENTS

Figure 1:
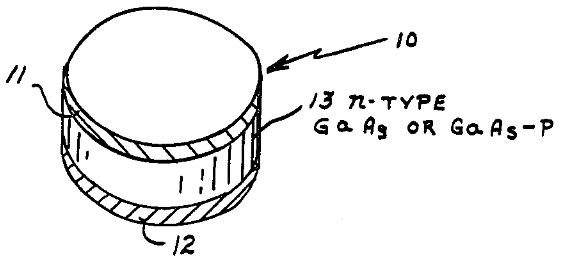
FIG. 1 shows a typical transferred-electron device (Gunn effect device) utilized in the push-pull transferred-electron oscillator.
Figure 2:
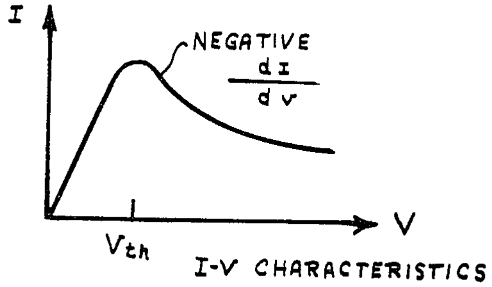
FIG. 2 shows a typical I–V characteristic curve of a transferred-electron device.

Now referring to FIG. 1, there is shown transferred-electron device 10 having ohmic contacts 11 and 12. Transferred-electron device 10 is conventional and is such as shown and described in U.S. Pat. No. 3,393,375 issued 16 July 1968 and entitled, "Circuits for Combining the Power Outputs of a Plurality of Negative Resistance Device Oscillators". A transferred-electron device (also called Gunn effect device) is composed of crystal 13 of GaAs or other III–V or II–VI compound or alloys of III–V or II–VI compounds, with ohmic contacts 11 and 12. Transferred-electron device 10 exhibits a voltage controlled negative resistance when it is biased at a voltage above the threshold. This negative resistance results in voltage and current instabilities at microwave frequencies and the device can therefor generate microwave power. FIG. 2 shows a typical I–V characteristic curve of a transferred-electron device. It is noted that an oscillator is comprised of a resonator and associated driving system so that the Gunn device is part of the driving system of the oscillator of the present invention.

Figure 3:
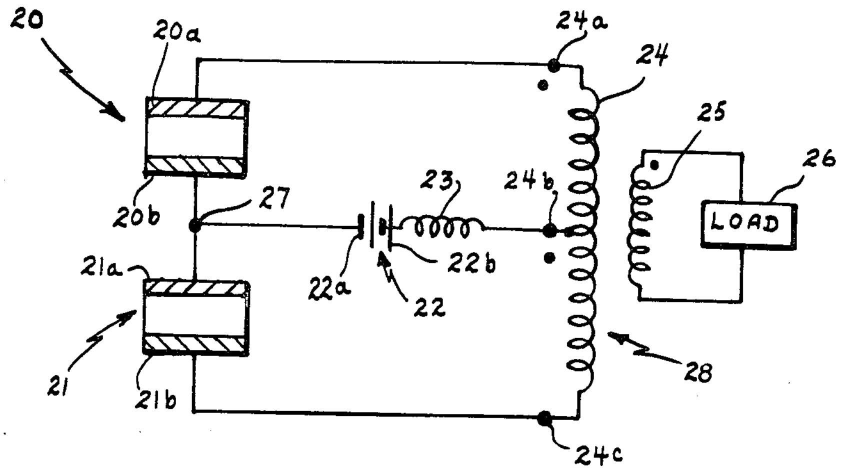
FIG. 3 shows an equivalent schematic representation of the push-pull transferred-electron oscillator circuit of the present invention.

Now referring to FIG. 3, there is shown an equivalent schematic diagram of the push-pull transferred-electron oscillator circuit of this invention. Transferred-electron devices 20 and 21 are of the type shown in FIG. 1 on transferred-electron device 10. Transferred-electron devices 20 and 21 have ohmic contacts **20*a*, 20*b*, and 21*a*, 21*b*, respectively. Ohmic contacts 20*b* and 21*a* are connected to point 27. Point 27 is also connected to one end 22*a* of common DC bias source 22. There is shown push-pull resonators 28 having center-tapped winding 24 and single-ended winding 25. Winding 24 is shown with electrical contacts 24*a*, 24*b*, and 24*c*; 24*b* being a center tap. Contacts 24*a* and 24*c* are connected to ohmic contacts 20*a* and 21*b*, respectively. Center tap contact 24*b* is connected to the other end of 22*b* of common bias source 22 by way of RF (Radio Frequency) choke 23. Load 26 is connected across winding 25**.

In the operation of the circuit, transferred-electron devices 20 and 21 are connected in parallel to the DC bias circuit being composed of bias source 22. In the RF resonant circuit including winding 24, they operate in a push-pull manner. The RF choke 23 is utilized to suppress unwanted RF energy. The parallel connection in the bias circuit avoids the burn-out problem of series connection, while the push-pull operation increases the RF impedance by four times in comparison with the simple parallel connection scheme of the same number of devices for the same power level. The power is coupled out by means of winding 25 and then delivered to load 26.

Figures 4, 5:
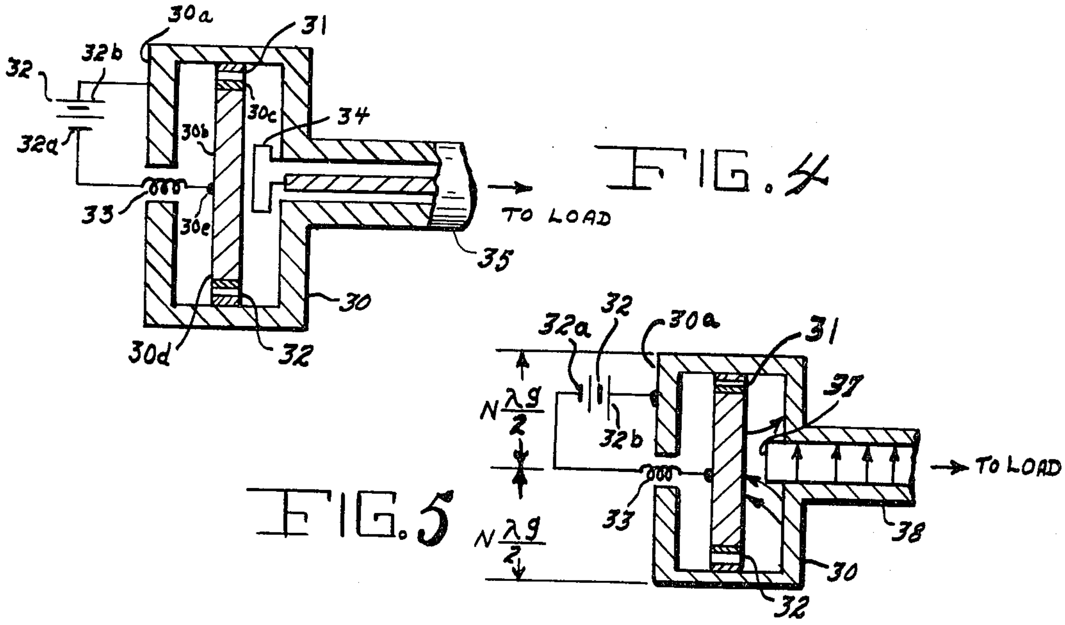
FIG. 4 shows an embodiment of the push-pull transferred-electron oscillator including a coaxial resonator, a coaxial transmission line, and a coupling loop.
FIG. 5 shows a push-pull transferred-electron oscillator circuit having a coaxial resonator similar to that of FIG. 4 and a rectangular waveguide coupled by a window at the midpoint of the resonator.

Now referring to FIG. 4, there is shown an embodiment of the push-pull transferred-electron oscillator circuit including coaxial resonator 30. Connected at each end of coaxial resonator 30 are transferred-electron devices 31 and 32 making friction fit electrical contact between outer conductor **30*a* and inner conductor 30*b*. Inner conductor 30*b* includes ends 30*c* and 30*d* also midpoint 30*e*. Devices 31 and 32 are identical to devices 20 and 24 of FIG. 3. DC bias source 32** is shown with end 32*b* connected to outer conductor 30*a* of coaxial resonator 30; other end 32*a* is connected to the midpoint of inner conductor 30*b* of coaxial resonator 30 by way of RF choke 33. Coupling loop 34 is utilized to transfer the power from coaxial resonator 30 to coaxial transmission line 35 for distribution to a load.

The oscillator circuit is composed of coaxial resonator 30 operating as push-pull resonators, coaxial transmission line 35 and a coupling loop. The length of the coaxial resonator is approximately one wavelength and the dimension of the inner and outer conductors are such that only the TEM mode can propagate in the resonator. The coupling loop is placed at the midpoint. Transferred-electron devices 31 and 32 are placed at each end of the resonator and connections are made so that devices 31 and 32 are connected in parallel to the DC bias circuit, but, in the RF circuit they operate in push-pull manner to provide the desired power. The power is transferred to a load by way of coupling loop 34 and coaxial transmission line 35. It is noted coaxial resonator 30 is arranged to operate as push-pull resonators.

Now referring to FIG. 5, there is shown another embodiment of the push-pull transferred-electron oscillator having a push-pull coaxial resonator identical to that of FIG. 4 except for the $N\lambda g/2$ dimension as indicated at FIG. 5. Upon resonating, however, the power from the coaxial resonator is coupled therefrom by window 37 and then distributed to a load by way of waveguide 38.

In an experimental circuit of a coaxial resonator and a waveguide as shown in FIG. 5, the coaxial resonator was designed for a resonant frequency of about 10 GHz. Devices 31 and 32 about 4.5 mils in diameter fabricated from an epitaxially grown GaAs material in an *n+n—n+* structure were mounted in the oscillator. When devices 31 and 32 were biased above the threshold voltage, the oscillator generated coherent RF output power. The frequency of oscillation was about 9.6 GHz. The maximum output power of 76 mw with DC-to-RF power conversion efficiency of 2.7 percent was obtained at 8.0 bias voltage. The devices, when operated individually in a conventional oscillator circuit, generated about 25 mw of RF power each.

Figure 6:
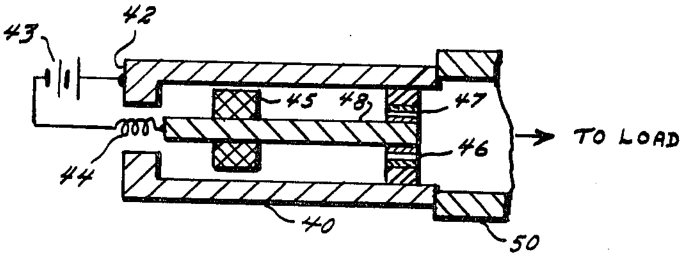
FIG. 6 shows a push-pull transferred-electron oscillator circuit including a coaxial resonator and a rectangular waveguide coupled end-to-end.

Now referring to FIG. 6, there is shown yet another embodiment which is composed of coaxial resonator 40 and rectangular waveguide 50 coupled end-to-end. Transferred-electron devices 46 and 47 are placed at the junction between coaxial resonator 40 and rectangular waveguide 50 along a diameter. Outer conductor 42 is connected by way of DC bias source 43 and RF choke 44 to inner conductor 48. There is also provided movable RF choke 45 which is friction fitted around inner conductor 42.

The dimensions of the coaxial resonator are such that the coaxial $TE_{11}$ mode can propagate. Note that the TEM mode of the coaxial resonator cannot be coupled to the $TE_{10}$ mode of the rectangular waveguide in this configuration.

Figure 7:
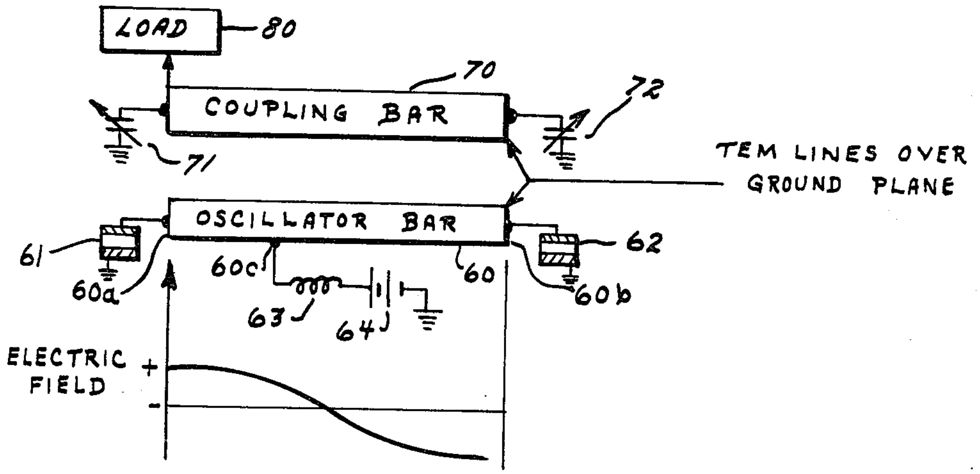
FIG. 7 shows a push-pull transferred-electron oscillator circuit which includes two coupled TEM lines.

Referring to FIG. 7, still another embodiment of a push-pull transferred-electron oscillator is shown which is comprised of two coupled TEM lines over a ground plane. One line is oscillator line 60 having ends 60*a*, 60*b* and midpoint *c*. Midpoint *c* is connected to ground by series arrangement of RF choke 63 and bias voltage source 64. Line 60 has transferred electron devices 61 and 62 spaced at either end and connected to ground and thus, there is provided push-pull resonators and the associated driving system. The other line is called coupling line 70 and is coupled to oscillator line 60 and provides matching to load 80. Coupling line 70 is connected to ground at one end thereof by tuning capacitor 71 and at the other end by tuning capacitor 72. This structure can be realized in either conventional strip-line or microstrip circuits. The microstrip configuration is especially attractive since it is compatible with fully integrated circuits.

Operation of the arrangement illustrated in FIG. 7 has been realized experimentally in a conventional strip-line circuit.

The two transferred-electron devices, which had delivered 40 watts and 30 watts, respectively, when optimized separately, delivered 70 watts of peak power at 1.5 GHz with a conversion efficiency of 14.5 percent. The electric field for oscillator line 60 is indicated schematically therebelow.

The push-pull arrangement is not limited to the circuits illustrated but may be realized in a large number of waveguide, coaxial cavity and integrated microstrip resonators.

We claim:

1. A push-pull transferred-electron oscillator comprising a common bias voltage source to provide a predetermined above threshold voltage, first and second transferred-electron devices, each of said devices exhibiting a voltage controlled negative resistance upon being biased at a predetermined voltage above threshold resulting in voltage and current instabilities at microwave frequencies, said devices being connected in parallel to said common bias voltage source, push-pull microwave resonators having said first and second devices connected to said push-pull resonators, respectively, for driving purposes, said push-pull resonators being comprised of a ground plane, an oscillator line positioned over said ground plane, said oscillator line having first and second ends and a midpoint, said first device being connected between said first end and ground, and said second device between said second end and ground, a radio frequency choke in a series arrangement with said bias voltage source, said series arrangement being connected between said midpoint and ground, and means to couple power from said push-pull resonators to a load.

2. A push-pull transferred electron oscillator as described in claim 1 wherein said means to couple power is comprised of a coupling line positioned adjacent to said oscillator line, said coupling line having first and second ends, and first and second variable capacitors connected between ground and said first and second ends, respectively, of said coupling line.

* * * * *